(12) United States Patent
Saito

(10) Patent No.: US 6,304,073 B1
(45) Date of Patent: Oct. 16, 2001

(54) IC TESTING APPARATUS

(75) Inventor: Noboru Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/337,275

(22) Filed: Jun. 22, 1999

(30) Foreign Application Priority Data

Jun. 25, 1998 (JP) .................................................. 10-178779

(51) Int. Cl.⁷ .............................. G01R 31/02; G01R 1/04
(52) U.S. Cl. ...................... 324/158.1; 324/757; 324/755
(58) Field of Search ....................... 324/158.1, 754–765, 324/755, 757, 758, 761

(56) References Cited

U.S. PATENT DOCUMENTS 4,899,107 * 2/1990 Corbett et al. ....................... 324/765
5,596,282 * 1/1997 Giddings et al. .................... 324/754
6,069,483 * 5/2000 Maxwell et al. ..................... 324/760

* cited by examiner

*Primary Examiner*—Safet Metjahic
*Assistant Examiner*—Anjan K Deb
(74) *Attorney, Agent, or Firm*—Birch, Stewart, Kolasch & Birch, LLP

(57) ABSTRACT

An IC testing apparatus excels in giving a DUT a unified press force toward a contact portion, which carries out a test by pressing input/output terminals of the DUT against contact pins 51 of a test head, and comprises a pusher base 34 provided movably and close to but away from the contact pins 51, a pusher block 31 mounted on the pusher base for pressing the DUT, and a spring 36 for giving an elastic force to the pusher block in the pressing direction.

4 Claims, 13 Drawing Sheets

IC TESTING APPARATUS

BACKGROUND OF THE INVENTION

1. Field of the Invention

The present invention relates to an IC testing apparatus for testing one or more semiconductor integrated circuit devices and other various electric devices (hereinafter referred to as an "IC" or "ICs" to represent them), more particularly relates to an IC testing apparatus which excels in attaining a uniformity of a pressing force against a contact portion of an IC to be tested.

2. Description of the Related Art

An IC testing apparatus called a "handler" conveys a large number of ICs held on a tray to the inside of a testing apparatus where the ICs are made to electrically contact a test head, then the IC testing unit is made to perform the test. When the test is ended, the ICs are conveyed out from the test head and reloaded on trays in accordance with the results of the tests so as to sort them into categories of good ICs and defective ones, etc.

In an IC testing apparatus of the related art, the trays for holding the DUTs (Devices under test) to be tested or the tested DUTs (hereinafter referred to as "customer trays") and the trays conveyed circulated inside the IC testing apparatus (hereinafter referred to as the "test trays") are different in type. In this type of IC testing apparatus, the ICs are switched between the customer trays and the test trays before and after the test. In the test process where the ICs are tested by being brought into contact with the test head, the ICs are pushed against the test head in the state held on the test trays.

In test processing of an IC testing apparatus of the related art, an IC to be tested is pressed against contact pins by lowering a press mechanism called pusher. The lowering limit of the pusher is decided by a stopper which makes the distance between the pusher and the contact portion a predetermined distance.

However, there exists not a small production error between a thickness of an IC to be tested itself (the error is defined as $\Delta X$), a production dimension of the stopper on the pusher side and the pusher surface (the error is defined as $\Delta Y$), and a production dimension of the stopper on the contact portion side and tips of the contact pins (the error is defined as $\Delta Z$), and the multiplied amount of $\Delta X$ to $\Delta Z$ normally becomes as much as about ±0.1 to ±0.2 mm.

Therefore, when the multiplied error of $\Delta X$ to $\Delta Z$ becomes, for example, +0.04 mm, as shown in a pusher stroke-load curve in FIG. 13, a load of 45 gf/1 ball is actually acted on the IC to be tested for the reference load of 25 gf/1 ball (in this case, it is sufficient if the pusher stroke is set at 0.18 mm). This causes a fear that the IC is damaged or broken. Contrary to this, when the multiplied error of $\Delta X$ to $\Delta Z$ varies, for example, by −0.1 mm to the minimum side, it is liable that a sufficient press force cannot be obtained and the test cannot be carried out.

Though the total error can be reduced by improving respective dimension precision of the pusher and the contact portion, there is a certain limit to attaining such dimension precision. Moreover, since dimension precision of a package mold is quite rough in chip size packages (CSP), etc., the production error $\Delta X$ becomes large when an IC to be tested is a CSP chip. Therefore, only attaining higher precision of the pusher and contact portion is not enough as a countermeasure.

SUMMARY OF THE INVENTION

An object of the present invention is to provide an IC testing apparatus which excels in giving a unified press force to a contact portion of an IC to be tested.

(1) According to the present invention, there is provided an IC testing apparatus for testing by pressing input/output terminals of DUTs to a contact portion of a test head, comprises a pusher base provided movably and close to but away from the contact portion, a pusher block provided on the pusher base for pressing the DUTs by contacting the same from the opposite side of the contact portion, and an elastic part for giving an elastic force to the pusher block in the direction of pressing the DUTs.

In an IC testing apparatus of the present invention, when the input/output terminal of the IC to be tested is pressed against the contact portion of the test head, the pusher base is made close to the contact portion and the IC is pressed against the contact portion side by a pusher block.

At this time, positional relationship of the pusher base and the contact portion is regulated/controlled to be a reference dimension by a mechanical mechanism of the stopper, etc. and an electric mechanism of an electric motor, etc. However, when an error arises in the positional relationship of the pusher base and the contact portion, the pusher block absorbs the error while biasing an elastic force on the IC to be tested by an elastic part. Accordingly, it can be prevented that an excessive press force acts on the IC, or the press force of the pusher is insufficient oppositely, etc. Namely, in the IC testing apparatus of the present invention, the press force to the IC is unified not by controlling strokes of the pusher but by controlling the load by the pusher block.

The elastic part according to the present invention is not specifically limited and a variety of elastic bodies and actuators, such as a coil spring, can be used. Also, the elastic part can be provided to any parts other than the pusher base.

As a main error arisen in the positional relationship of the pusher base and the contact portion, a thickness of an IC to be tested itself $\Delta X$, a production dimension of the stopper on the pusher side and the pusher surface $\Delta Y$, and a production dimension of the stopper on the contact portion side and tips of the contact pins $\Delta Z$ can be considered, and as explained in the above, the multiplied amount of $\Delta X$ to $\Delta Z$ becomes as much as about ±0.1 to 0.2 mm. However, when considering a case of using, for example, a coil spring as the elastic part, the error of the press force acting on the IC to be tested becomes about ±3 gf/1 ball with respect to the reference load of 25 gf/1 ball, for example, even when an error of 2 mm arises. Therefore, there is no disadvantage of an excessive load not a load shortage.

(2) In the IC testing apparatus of the present invention, the form of transferring the IC to be tested to the contact portion is not specifically limited, and it also includes a type of pressing the IC to the contact portion by a suction head while carrying the IC by suction and a type of pressing the IC to the contact portion while carrying the IC on a tray. Especially in the latter type, since a large number of ICs are simultaneously pressed for testing a large number of ICs simultaneously, an error is easy to be arisen in the positional relationship of the pusher and the contact portion. Accordingly, a type of pressing the IC to the contact portion in the state the ICs are carried by trays is preferably applied in the present invention.

(3) In an elastic part according to the present invention, it is not specifically limited, but it is preferable that the elastic force of the elastic part is made variable.

The variability of the elastic force means that the elastic force given to the pusher block in the direction of pressing the IC to be tested is made changeable, and specific means is not specifically limited.

For example, making the elastic force variable by exchanging a plurality of kinds of elastic part having a different elastic modulus, or making the elastic force variable by using the same elastic part and changing a reference length thereof can be mentioned.

By making the elastic force of the elastic part variable, even if the reference load (press force) changes in accordance with test conditions of an IC to be tested and others, it becomes possible to flexibly deal with the changes, therefore, the IC testing apparatus becomes more general purpose.

(4) To attain the above object, according to another aspect of the present invention, there is provided an IC testing apparatus for testing one or more semiconductor devices to be tested by holding between a pusher and a contact portion of a test head in order for input/output terminals of the semiconductor devices to be brought to contact the contact portion, wherein the pusher is provided able to move forward and backward from the semiconductor devices, and is given with a force in a direction of resisting to a force acting on the semiconductor devices from the contact portion.

In the IC testing apparatus of the present invention, when holding the IC between the pusher and the contact portion, even in a case where the positional relationship of the pusher and the contact portion is out of the reference dimension, the pusher moves forward or backward with respect to the IC in accordance with an amount of the gap. Furthermore, at this time, since the pusher is given a force in the direction resisting to the force acted on the IC from the contact portion, the force of holding the IC between the pusher and the contact portion (namely, the press force on the IC) is kept at an almost constant value. Accordingly, it can be prevented that an excessive press force is acted on the IC or that the press force is insufficient oppositely.

(5) ICs to be tested applied in this invention are not specifically limited and all kinds of ICs are included. When the present invention is applied to a chip size package (CSP) type IC wherein the production dimension precision of a package mold is quite rough, the efficiency becomes especially remarkable.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Figure 1:
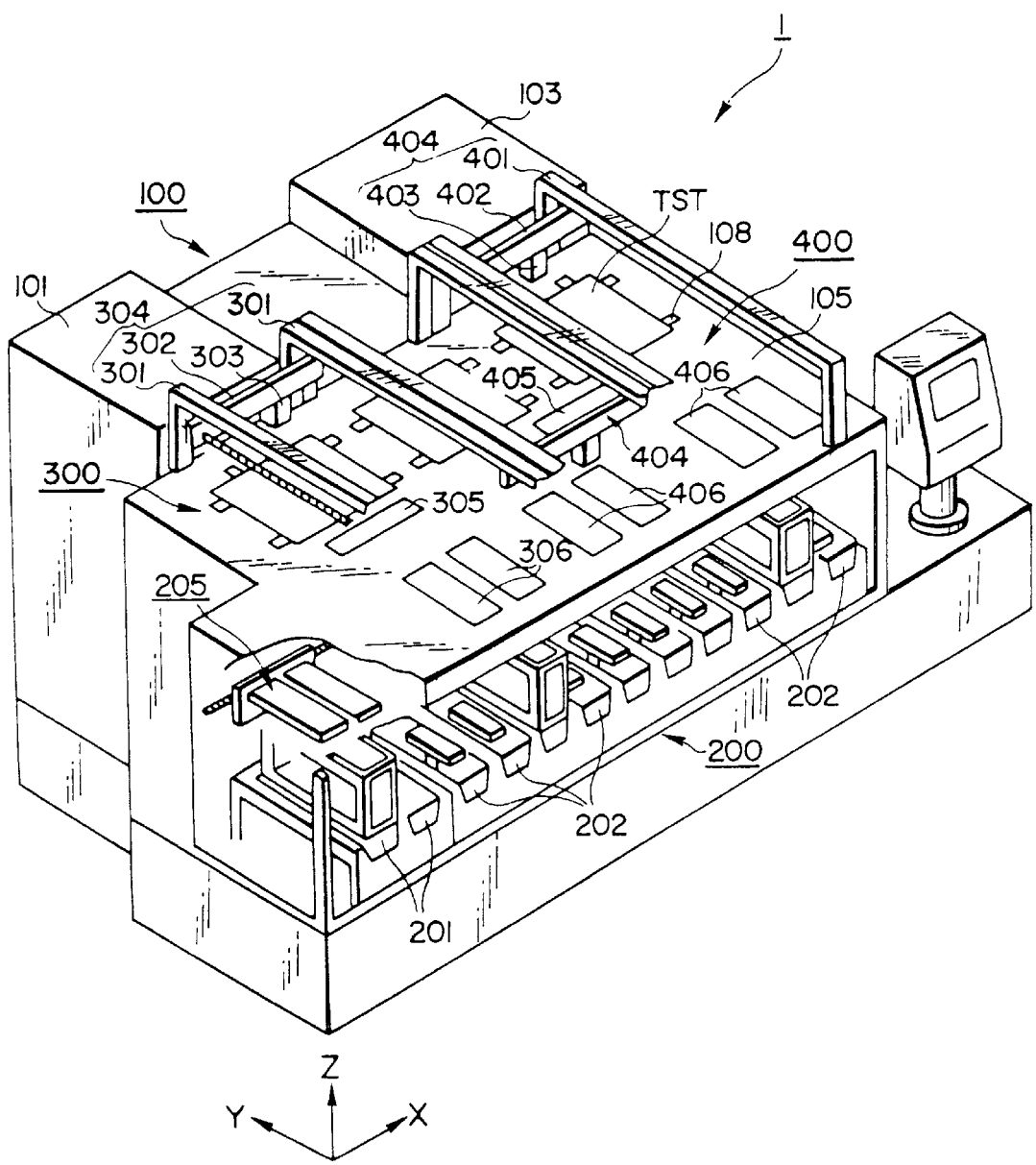
FIG. 1 is a perspective view of a first embodiment of an IC testing apparatus according to the present invention.
Figure 2:
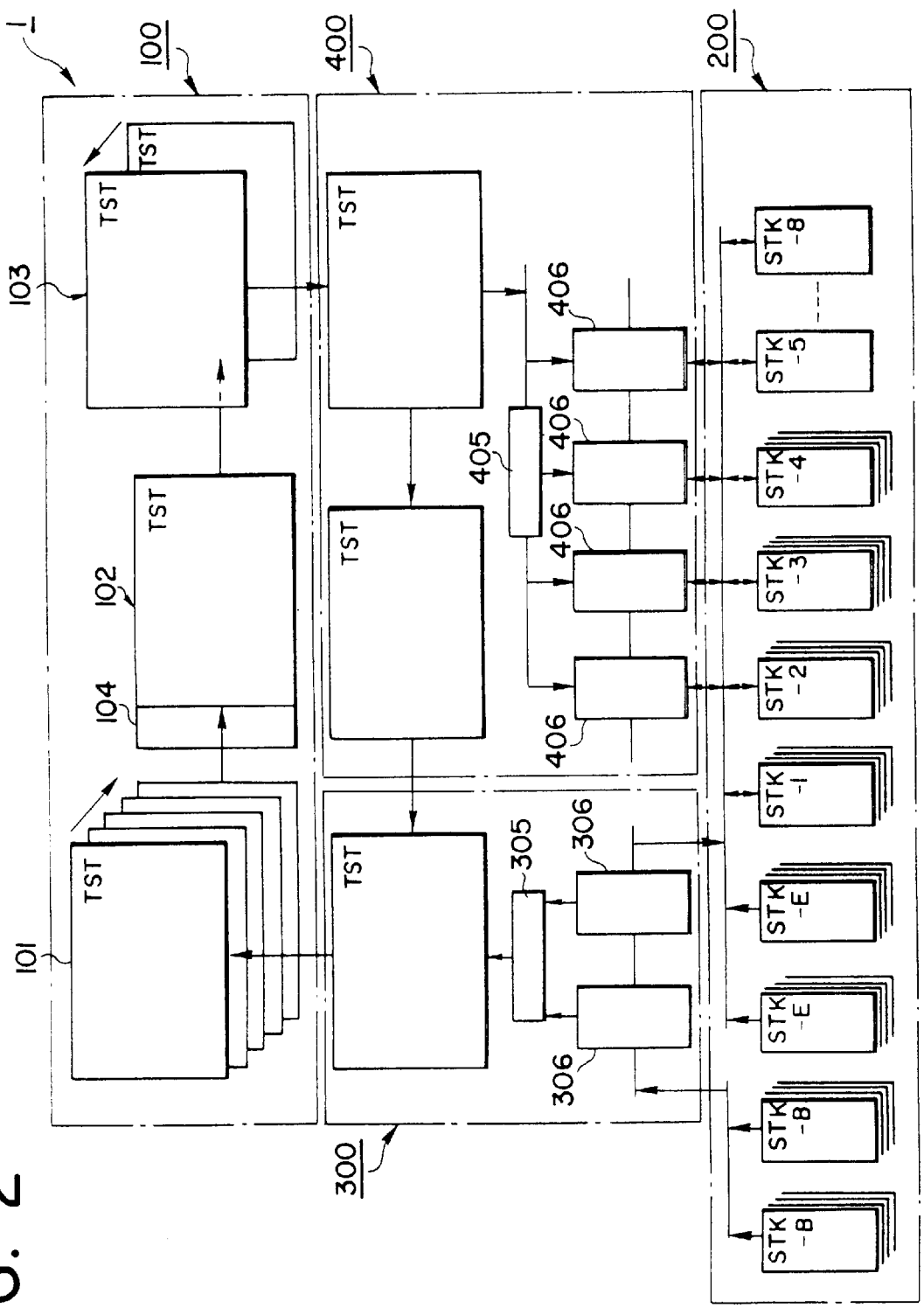
FIG. 2 is a flow chart of a tray showing a method of handling an IC to be tested in the IC testing apparatus of FIG. 1.

FIG. 2 is a view for explaining the method of handling of a DUT(device under testing) in the IC testing apparatus of the present embodiment and shows by a plan view members actually arranged aligned in the vertical direction. Therefore, the mechanical (three-dimensional) structure is explained with reference to FIG. 1.

Figure 4:
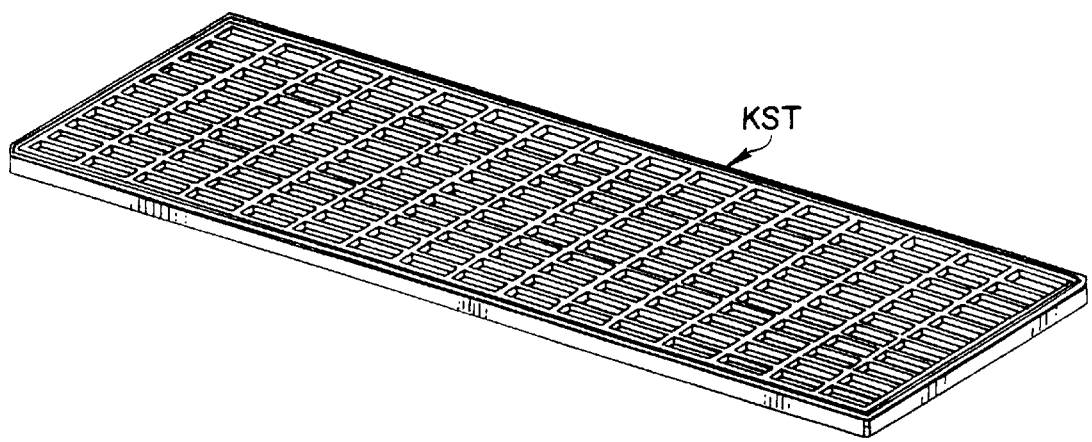
FIG. 4 is a perspective view of a customer tray used in the IC testing apparatus of FIG. 1.

The IC testing apparatus 1 of the present embodiment tests (inspects or checks) whether the IC is operating suitably in a state applying a high temperature or low temperature thermal stress to the DUT or not applying, and classifies the DUTs in accordance with the test results. The operating test in the state with thermal stress applied is performed by reloading the DUTs from the tray carrying a large number of DUTs to be tested (hereinafter also called as "customer tray KST", see FIG. 4) to a test tray TST (see FIG. 5) conveyed through the inside of the IC testing apparatus 1.

Therefore, the IC testing apparatus 1 of the present embodiment, as shown in FIG. 1 and FIG. 2, is comprised of an IC magazine 200 which holds the DUTs to be tested or classifies and stores the tested DUTs, a loader section 300 which sends the DUTs from the IC magazine 200 into a chamber section 100, a chamber section 100 including a test head, and an unloader section 400 classifying and taking out tested DUTs which had been tested in the chamber section 100.

IC Magazine 200

The IC magazine 200 is provided with a pre-test IC stocker 201 for holding DUTs to be tested and a tested IC stocker 202 for holding DUTs classified in accordance with the test results.

Figure 3:
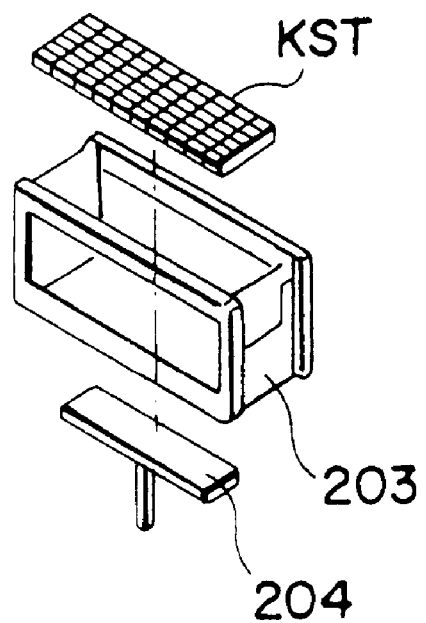
FIG. 3 is a perspective view of the structure of an IC stocker of the IC testing apparatus of FIG. 1.

These pre-test IC stocker 201 and post-test IC stocker 202, as shown in FIG. 3, are each comprised of a frame-shaped tray support frame 203 and an elevator 204 able to enter from under the tray support frame 203 and move toward the top. The tray support frame 203 supports in it a plurality of stacked customer trays KST. Only the stacked customer trays KST are moved up and down by the elevator 204.

The pre-test IC stocker 201 holds stacked customer trays KST on which the DUTs to be tested are held, while the post-test IC stocker 202 holds stacked customer trays KST on which DUTs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need.

In the example shown in FIG. 1 and FIG. 2, the pre-test stocker 201 is provided with two stockers STK-B and provided next to that with two empty stockers STK-E to be sent to the unloader section 400, while the post-test IC stocker 202 is provided with eight stockers STX-1, STK-2, . . . , STK-8 and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The above-mentioned customer tray KST is convey ed from the lower side of the test board 105 to an opening 306 of the loader section 300 by a tray transfer arm 205 provided between the IC magazine 200 and test board 105. Further, in the loader section 300, the DUTs loaded on the customer tray KST are transferred once to a preciser 305 by the X-Y-conveyor 304. There, the mutual positions of the DUTs are corrected, then the DUTs transferred to the preciser 305 are reloaded on the test tray TST stopped at the loader section 300 using the X-Y conveyor 304 again.

The X-Y conveyor 304 reloading the DUTs from the customer tray KST to the test tray TST, as shown in FIG. 1, is provided with two rails 301 laid over the top of the test board 105, a movable arm 302 able to move back and forth (this direction is designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the DUTs from the customer tray KST and reload the DUTs on the test tray TST. For example, about eight suction heads are provided for the movable head 303, so it is possible to reload eight DUTs at one time on the test tray TST.

Note that in a general customer tray KST, indentations for holding the DUTs are formed relatively larger than the shapes of the DUTs, so the positions of the DUTs in a state held on the customer tray KST can vary largely. Therefore, if the DUTs are picked up by the suction heads and conveyed directly to the test tray TST in this state, it becomes difficult for the ICs to be dropped accurately into the IC receiving indentations formed in the test tray TST. Therefore, in the IC testing apparatus 1 of the present embodiment, an IC position correcting means called a preciser 305 is provided between the set position of the customer tray KST and the test tray TST. This preciser 305 has relatively deep indentations surrounded with inclined surfaces at their circumferential edges, so when DUTs picked up by the suction heads are dropped into these indentations, the drop positions of the DUTs are corrected by the inclined surfaces. Due to this, the positions of the eight DUTs with respect to each other are accurately set and it is possible to pick up the correctly positioned DUTs by the suction heads once again and reload them on the test tray TST and thereby reload the DUTs precisely in the IC receiving indentations formed in the test tray TST.

Chamber Section 100

The above-mentioned test tray TST is conveyed into the chamber section 100 after being loaded with the DUTs by the loader section 300, then the DUTs are tested in a state carried on the test tray TST.

The chamber section 100 is comprised of a constant temperature chamber 101 for giving a desired high temperature or low temperature thermal stress, or no thermal stress to the DUTs loaded on the test tray TST, a test chamber 102 for making the DUTs contact the test head in a state given the thermal stress or no thermal stress by the constant temperature chamber 101, and a soak chamber 103 for removing the given thermal stress from the DUTs tested in the test chamber 102.

In the soak chamber 103, when a high temperature was applied in the constant temperature chamber 101, the DUTs are cooled by blowing in air to return them to room temperature. Alternatively, when a low temperature of about −30° C. has been applied in the constant temperature chamber 101, it heats the DUTs by hot air or a heater etc. to return them to a temperature where no condensation occurs. Next, the thus treated DUTs are conveyed out to the unloader section 400.

As shown in FIG. 1, the constant temperature chamber 101 and soak chamber 103 of the chamber section 100 are arranged so as to project upward from the test chamber 102. Further, the constant temperature chamber 101 is provided with a vertical conveyor as shown schematically in FIG. 2. A plurality of test trays TST stand by supported by the vertical conveyor until the test chamber 102 becomes empty. While standing by, a high temperature or low temperature thermal stress is applied to the DUTs.

The test chamber 102 has a test head 104 arranged at its center. A test tray TST is conveyed above the test head 104 and the DUTs are tested by bringing their input-output terminals BB into electrical contact with the contact pins 51 of the test head 104. On the other hand, the test tray TST finished being tested is treated in the soak chamber 103 to return the temperature of the ICs to room temperature, then is discharged to the unloader section 400.

A test board 105 has a test tray conveyor 108 mounted on it. The test tray TST discharged from the soak chamber 103 by the test tray conveyor 108 is returned to the constant temperature chamber 101 through the unloader section 400 and the loader section 300.

Figure 5:
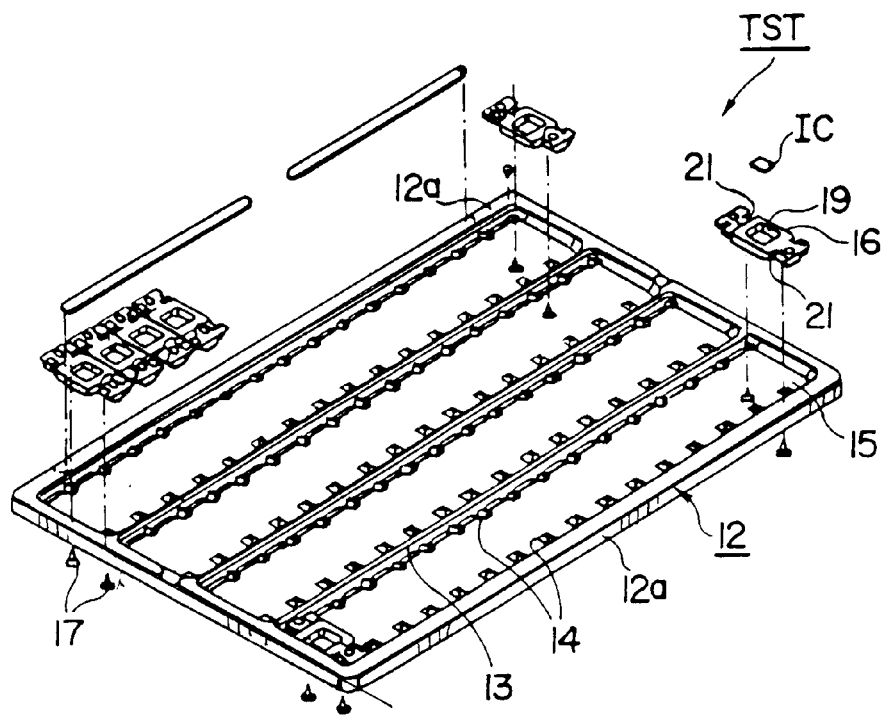
FIG. 5 is a partially disassembled perspective view of a test tray used in the IC testing apparatus of FIG. 1.

FIG. 5 is a disassembled perspective view of the structure of a test tray TST used in the present embodiment. The test tray TST is comprised of a rectangular frame 12 provided with a plurality of crosspieces 13 in parallel at equal intervals and has a plurality of mounting pieces 14 formed projecting out at equal intervals at the two sides of these crosspieces 13 and the sides 12a of the frame 12 facing the crosspieces 13. Insert holders 15 are comprised between these crosspieces 13, between the crosspieces 13 and the sides 12a, and the two mounting pieces 14.

The insert holders 15 are designed to receive one insert 16 each. An insert 16 is attached to the two mounting pieces 14 in a floating state using fasteners 17. Therefore, mounting holes 21 to the mounting pieces 14 are formed at the two ends of the inserts 16. For example, about 16×4 of these inserts 16 are provided in one test tray TST.

Note that the inserts 16 are made the same shape and same dimensions and that the DUTs are received in the inserts. The IC holder 19 of the insert 16 is determined by the shape of the DUT to be received and in the example shown in FIG. 5 is made a rectangular indentation.

Here, if the DUTs once connected to the test head 104 are arranged in four rows and 16 columns as shown in FIG. 5, then for example four rows of four columns of DUTs are simultaneously tested. That is, in the first test, the 16 DUTs arranged every fourth column from the first column are tested connected to the contact pins 51 of the test head 104. In the second test, the test tray TST is moved one column and the DUTs arranged every fourth column from the second column are similarly tested. By doing this a total of four times, all of the DUTs are tested. The results of the test are stored at addresses determined by for example the identification number assigned to the test tray TST and the numbers of the DUTs assigned inside the test tray TST.

Figure 6:
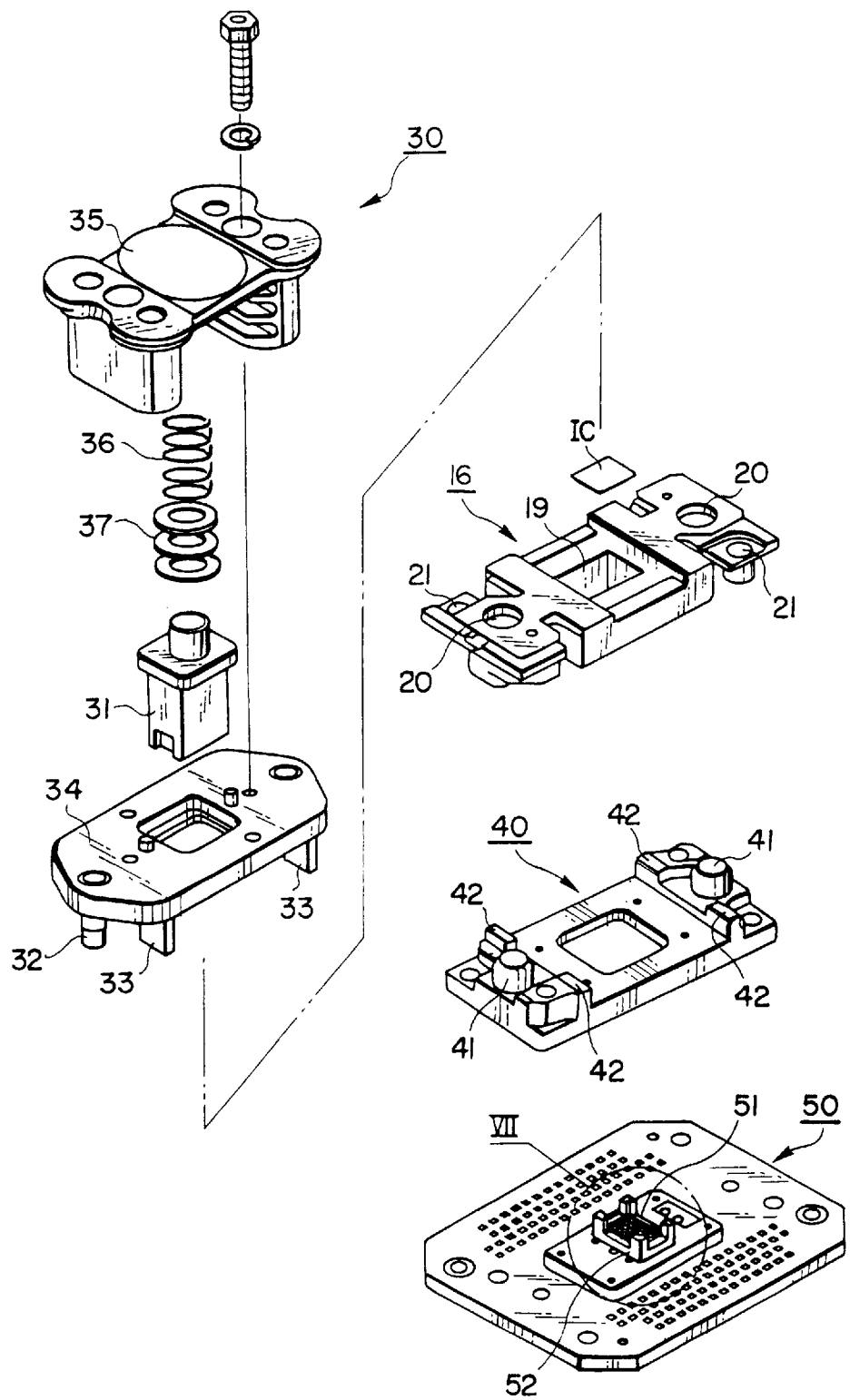
FIG. 6 is a disassembled perspective view of a pusher, insert (of the test tray), socket guide, and contact pins (of the contact portion) in the test head of FIG. 1.
Figure 7:
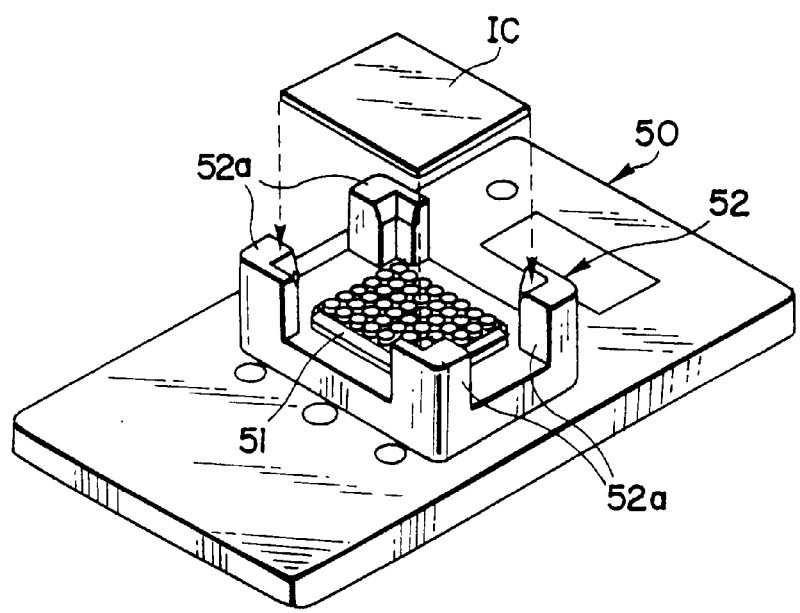
FIG. 7 is a perspective view showing the part VII of FIG. 6 enlarged.
Figure 8:
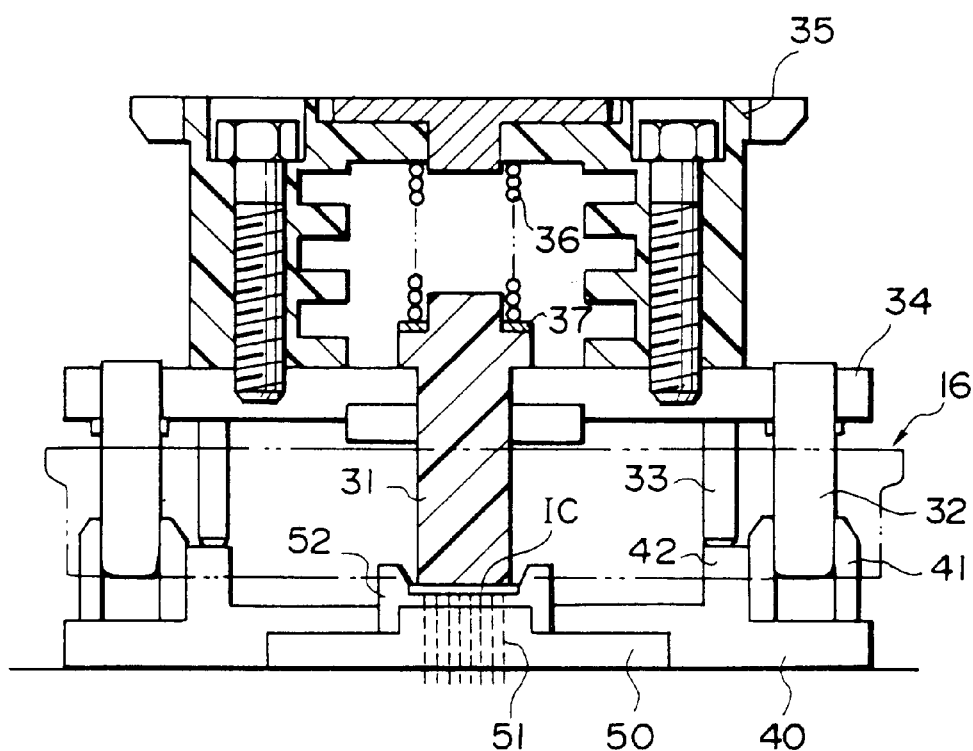
FIG. 8 is a sectional view of FIG. 6.
Figure 11:
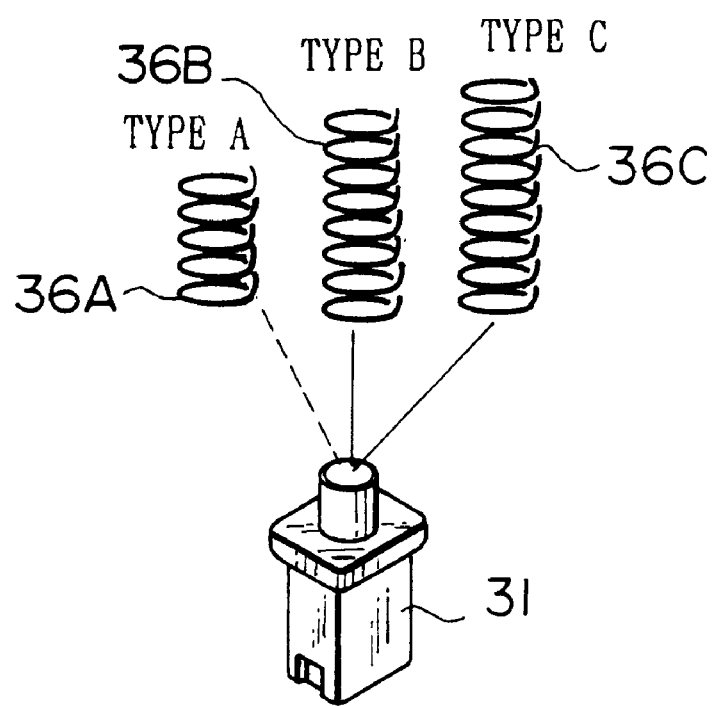
FIG. 11 is a disassembled perspective view showing another embodiment of the present invention.

FIG. 6 is a disassembled perspective view of a pusher 30, insert 16 (test tray TST side), socket guide 40, and contact pins 51 in the test head 104 of the IC testing apparatus, FIG. 7 is a perspective view showing the part VII of FIG. 6 enlarged, FIG. 8 is a sectional view of FIG. 6, and FIG. 11 is a sectional view of the state where a pusher 30 descends in the test head 104.

The pusher 30 is provided at the top side of the test head 104 and is moved vertically in the Z-direction by a Z-axial drive, not shown (for example, a fluid pressure cylinder). Pushers 30 are attached to the Z-axial drive corresponding to the intervals of the DUTs to be tested at one time (in the above test tray, total sixteen of four rows every four columns).

A pusher 30 is provided to the above Z-axial drive and comprises a lead pusher base 35 moving vertically in the z-direction, a pusher base 34 and a pusher block 41 attached to the pusher base 34 through a spring (corresponding to the elasticity means of the present invention) 36.

The lead pusher base 35 and the pusher base 34 are fixed by a bolt as shown in FIG. 6 and FIG. 8, and the both sides of the pusher base 34 are provided with guide openings 20 of an insert 16 and guide pins 32 inserted to a guide push 41 of a socket guide 40, which will be explained later on. Also, the pusher base 34 is provided with stopper guides 33 for regulating the lowering limit when the pusher base 34 is lowered by the z-axial drive means. The reference dimension of a position of the lowering limit of the pusher to press the DUTs with an appropriate pressure not to break them is determined by the stopper guides 33 by contacting the stopper surface 42 of the socket guide 40.

As shown in FIG. 6 and FIG. 8, the pusher block 31 is inserted to a through hole formed at the center of the pusher base 34, and a spring 36 and, in accordance with need, a shim 37 are attached between the space with the lead pusher base 35. The spring 36 is a compress spring (elastic body) biasing the pusher block 31 in the downward direction in the figures (toward the DUTs) by the spring and has a elasticity coefficient in accordance with the reference load with respect to the DUTs.

Also, the shim 37 adjusts a reference length in the state of mounting the spring and adjusts the initial load to act on the pusher block 31. Namely, even in a case of using a spring 36 of the same elasticity coefficient, the initial load acted on the pusher block 31 becomes larger by attaching the shim 37 therebetween. Note that the shim 37 is attached between the spring 36 and the pusher block 31 in the illustrated example, however, it is sufficient if the reference length of the spring 36 is adjustable, it may be attached, for example, between the lead pusher base 35 and the spring 36.

Figure 12:
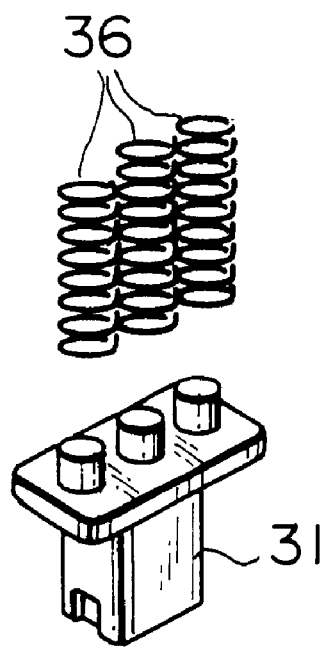
FIG. 12 is a disassembled perspective view showing another embodiment of the present invention.
Figure 13:
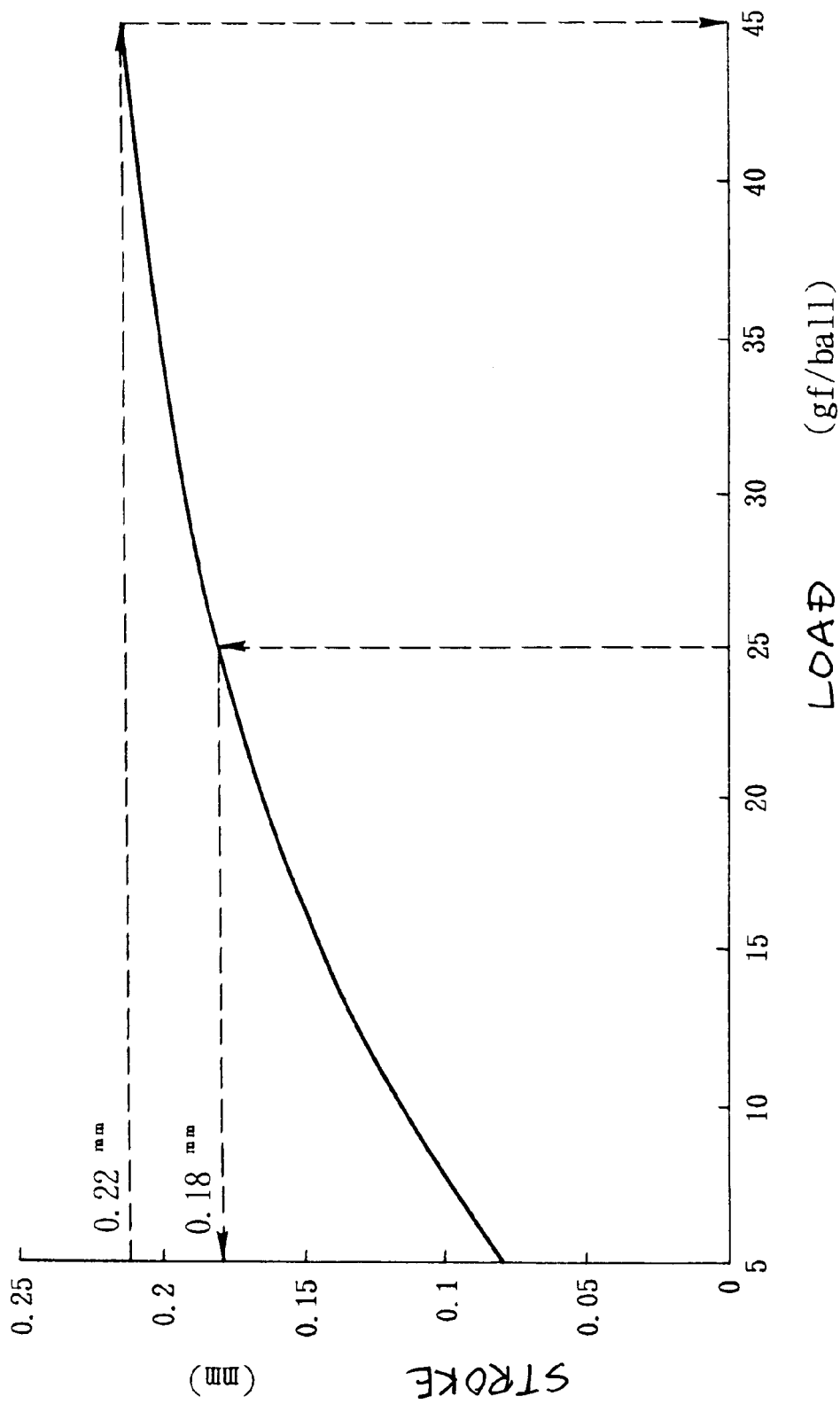
FIG. 13 is a stroke-load curve in an IC testing apparatus of the related art.

Also, in the case of using the spring 36 as the elasticity means according to the present invention, for example as shown in FIG. 11, it is possible to prepare a plurality of kinds of springs 36A, 36B and 36C having mutually different elasticity coefficient and select an appropriate spring to use in accordance with the reference load with respect to the DUTs. Furthermore, as shown in FIG. 12, the pusher block 31 may be configured able to be mounted a plurality of (here, it is three) springs 36, 36 and 36 in parallel and the number of springs to be mounted may be selected in accordance with the reference load with respect to the DUTs.

The insert 16, as explained also in FIG. 5, is attached to the test tray TST using a fastener 17. It is formed at its two sides with guide holes 20 through which the above-mentioned guide pins 32 of the pusher 30 and the guide bushes 41 of the socket guide 40 are inserted. As shown by the state of descent of the bush of FIG. 11, the guide hole 20 at the left side in the figure is made a small diameter at its upper half where the guide pin 32 of the pusher 30 is inserted for positioning and is made a large diameter at its lower hole where the guide bush 41 of the socket guide 40 is inserted for positioning. Note that the guide hole 20 at the right side in the figure fits with play with the guide pin 32 of the pusher 30 and the guide bush 41 of the socket guide 40.

As shown in FIG. 6, the insert 16 is formed at its center with an IC holder 19. By dropping a DUT here, the DUT is loaded on the test tray TST.

On the other hand, the socket guide 40 fixed to the test head 104 is provided at its two sides with guide bushes 41 for insertion of the two guide pins 32 of the pusher 30 and positioning with these two guide pins 32. The guide bush 41 at the left side also performs positioning with the insert 16.

At the lower side of the socket guide 40 is fixed a socket 50 having a plurality of contact pins 51. These contact pins 51 are biased in the upward direction by not shown springs. Therefore, even if pushing a DUT, the contact pins 51 will retract to the top surface of the socket 50. On the other hand, it is possible for the contact pins 51 to contact all of the terminals HB even if the DUTs are pushed somewhat at an angle.

Note that in the present embodiment, as shown in FIG. 6 and FIG. 7, by regulating the outer circumferential surface of a package mold of DUTs, a device guide 52 to determine the position of the same is provided to the socket 50. The device guide 52, as shown in FIG. 7, has wall portions 52a having a taper portion for drawing in around the four corners of the DUTs, and between the walls are cut off. Due to this, it is possible to hold the DUT in the device guide 52 in the state the IC holder 19 of the insert 16 is holding the DUT. The socket guide 52 can be formed to be united with the socket 50, and if the dimension precision is secured with the socket 50, it can be formed as a separate part and jointed. The device guide 52 can be also provided to the socket guide 40 side instead of providing it to the socket 50.

Unloader Section 400

The unloader section 400 is provided with two X-Y conveyors 404, 404 of the same structure as the X-Y conveyor 304 provided at the loader section 300. The X-Y conveyors 404, 404 reload the post-test ICs from the test tray TST carried out to the unloader section 400 to the customer tray KST.

As shown in FIG. 1, the test board 105 of the unloader section 400 is provided with two pairs of openings 406, 406 arranged so that the customer trays KST carried to the unloader section 400 can be brought close to the top surface of the test board 105.

Further, while not illustrated, an elevator table for elevating or lowering a customer tray KST is provided below the openings 406. A customer tray KST becoming full after being reloaded with the tested DUTs is placed on here and lowered and the full tray is passed to the tray transfer arm 205.

Note that in the IC testing apparatus 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the openings 406 of the unloader section 400, one customer tray KST may be returned from the unloader section 400 to the IC magazine 200 and a customer tray KST to hold DUTs of the newly arising category may be transferred to the unloader section 400 in its place so as to hold these DUTs. If customer trays KST are switched in the middle of sorting work, the sorting work has to be interrupted during that time and therefore there is the disadvantage of a reduction in the throughput. Therefore, in the IC testing apparatus 1 of the present embodiment, a buffer section 405 is provided between the test tray TST and the opening 406 of the unloader section 400, and DUTs of a category rarely appearing are stored temporarily at this buffer section 405.

For example, the buffer section 405 is given a capacity able to hold 20 to 30 or so DUTs. A memory is provided for storing the category of ICs held at the IC holding locations of the buffer section 405. The categories and positions of the DUTs temporarily stored at the buffer section 405 are stored for each DUT. In the intervals of the sorting work or when the buffer section 405 has become full, customer trays KST of the categories to which the DUTs stored at the buffer section 405 belong are called up from the IC magazine 200 and the ICs received on these customer trays KST. At this time, sometimes the DUTs temporarily stored at the buffer section 405 span several categories, but at this time it is sufficient to call up several customer trays KST at one time from the openings 406 of the unloader section 400 when calling up customer trays KST.

The mode of operation will be explained next.

In the test process inside the chamber section 100, the DUTs are conveyed above the test head 104 in the state carried on the test tray TST shown in FIG. 5, more specifically the individual DUTs are conveyed in the state dropped into the IC holders 19 of the inserts 16 of the figure.

When the test tray TST stops at the test head 104, the Z-axial drive starts to operate and each pusher 30 shown in FIG. 8 descends with respect to each insert. The two guide pins 32, 32 of the pusher 30 pass through the guide holes 20, 20 of the inserts 16 and engage with the guide bushes 41, 41 of the socket guides 40.

This state is shown in FIG. 8. The inserts 16 and the pushers 30 have a certain degree of positional error with respect to the sockets 50 and socket guides 40 fixed to the test head 104 (that is, the IC testing apparatus 1 side). The guide pins 32 of the left sides of the pusher base 34 are fit into the small diameter holes of the guide holes 20 of the inserts 16 for positioning the pushers 30 and the inserts 16, as a result it is possible for the pusher block 31 attached to the pusher 34 to push the DUTs with respect to the X-Y direction at suitable positions.

Further, the large diameter hole of the guide holes 20 at the left sides of the inserts 16 engage with the guide bushes 41 of the left sides of the socket guides 40, whereby the inserts 16 and the socket guides 40 are positioned with respect to each other and whereby the positioning accuracy of the DUTs and the contact pins 51 is improved.

Furthermore, the DUTs held at the IC holders 19 of the inserts 16 are positioned (corrected in altitude) by being drawn in by the walls 52a of the device guides 52 provided at the sockets 50 or socket guides 40 when pushed by the pushers 30, so it is possible to realize positioning between the input-output terminals and the contact pins 51 with respect to the X-Y direction with a high accuracy.

Figure 9:
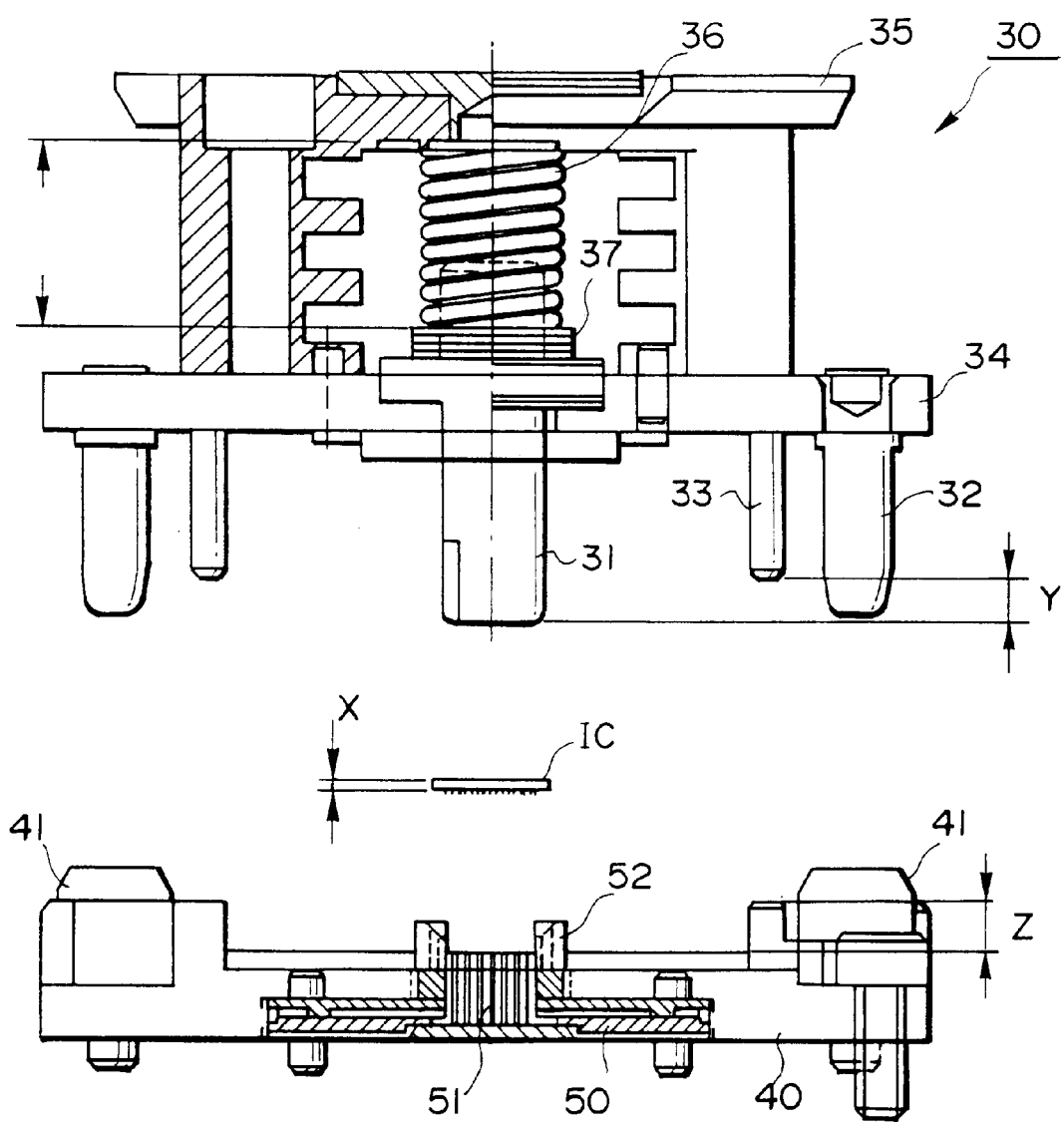
FIG. 9 is a sectional view showing the positional relationship of a pusher, socket guide and contact pins of FIG. 6.

On the other hand, with respect to the Z-direction, the load acted on the DUT at the time when the stopper guide 33 of the pusher base 34 contacts the stopper surface 42 of the socket guide 40 becomes a disadvantage. When the load is too large, it leads to damaging of the DUTs, while when it is too small, tests cannot be carried out. Accordingly, as shown in FIG. 9, it is necessary that the distance Y in the Z-direction between the stopper guide 33 of the pusher base 34 and the pusher block 31, and the distance Z in the Z-direction between the contact pins 51 and the stopper surface 42 of the socket guide 40 are required to be highly precisely made. However, there is a limit to do so, and in addition to that, a thickness X of the DUT itself largely affects.

However, the IC testing apparatus 1 of the present embodiment unifies the press force on the DUTs not by controlling the strokes of the pusher but by controlling the load from the pusher block 31. Therefore, even when errors $\Delta x$, $\Delta Y$ and $\Delta Z$ arise in the reference dimensions X, Y and Z, the pusher block 31 can absorb the errors while giving an elastic force to the DUT by the action from the spring 36. Accordingly, it can be prevented that an excessive press force is acted on the DUT or the press force is not strong enough oppositely.

Figure 10:
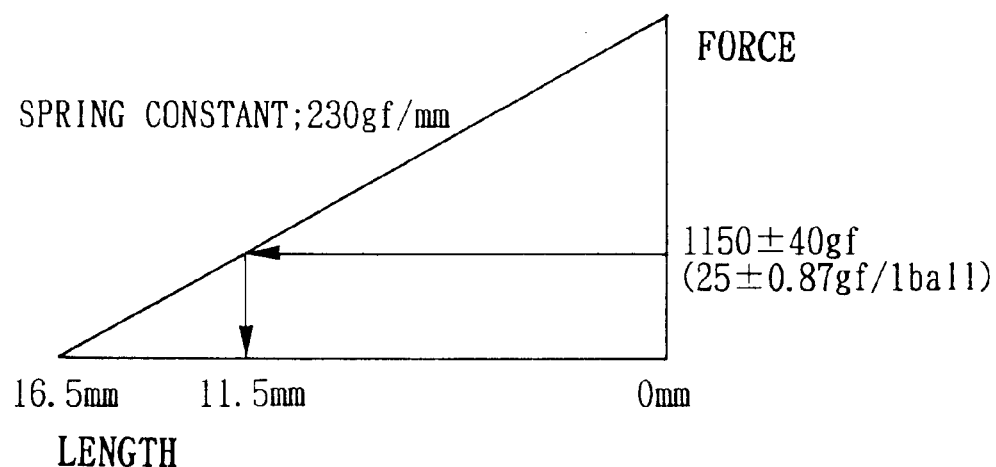
FIG. 10 is a graph showing the relationship of a spring length and a load.

To explain the above in detail with a representing embodiment, in the case of using a spring 36 having an elasticity coefficient of 230 gf/mm and length of 16.5 mm as shown in FIG. 10, when the reference load of the DUT having 46 terminals is set 25 gf/1 ball, the shim 37 are mounted while selecting how many to mount in order that the reference length of the spring 36 from the characteristic value of FIG. 10 becomes 11.5 mm. Here, if the multiplied amount of errors arisen in the above reference dimensions X, Y and Z are 0, the load acted on the DUT is (16.5 mm–11.5 mm)×230 gf/mm÷46 pins=25, which is the same as designed 25 gf/1 ball. While assuming that the above multiplied error is +0.4 mm on the maximum side, the load acted on the DUT becomes (16.5 mm–11.1 mm)×230 gf/mm÷46 pins=27 gf/1 ball. Oppositely, assuming that the multiplied error is –0.4 mm on the minimum side, the load acted on the DUT becomes (16.5 mm–11.9 mm)×230 gf/mm+46 pins=23 gf/1 ball. This is 25±3 gf/1 ball even when considering a load error of the spring 36, which is remarkably improved comparing the cases of controlling strokes of the related art.

Note that the embodiments explained above were described to facilitate the understanding of the present invention and not to limit the present invention. Accordingly, elements disclosed in the above embodiments include all design modifications and equivalents belonging to the technical field of the present invention.

According to the present invention, since strokes of the pusher is not controlled and the load by the pusher is controlled, the press force to the DUT is unified. Therefore, it can be prevented that an excessive press force is acted on the DUT or the press force is not sufficiently strong oppositely.

Also, by making the elasticity of the elasticity means variable, even if the reference load (press force) changes in accordance with the condition of the DUT or other test conditions, it is possible to flexibly handle the cases. Therefore, an IC testing apparatus being highly general-purpose can be provided.

What is claimed is:

1. An IC testing apparatus for testing by pressing input/output terminals of one or more semiconductor devices to be tested to a contact portion of a test head, comprising:

a pusher base provided movably and close to but away from the contact portion;

a pusher block provided on said pusher base for pressing the semiconductor devices by contacting the same from the opposite side of the contact portion;

an elastic part for giving an elastic force to said pusher block in the direction of pressing the semiconductor devices; and a shim for adjusting a reference length in the state of mounting said elastic part and adjusting an initial load of said elastic part to act on said pusher block.

2. An IC testing apparatus as set forth in claim 1, wherein the semiconductor device to be tested is pressed against the contact portion in the state being carried by a test tray conveyed through an inside of the IC testing apparatus.

3. An IC testing apparatus as set forth in claim 1, wherein an elastic force of said elastic part is made variable by changing said elastic part itself.

4. An IC testing apparatus as set forth in claim 2, wherein an elastic force of said elastic part is made variable by changing said elastic part itself.

* * * * *